(12) United States Patent
Takabe et al.

(10) Patent No.: US 7,719,297 B2
(45) Date of Patent: May 18, 2010

(54) PROBE APPARATUS AND METHOD FOR MEASURING ELECTRICAL CHARACTERISTICS OF CHIPS AND STORAGE MEDIUM THEREFOR

(75) Inventors: Kazuhiro Takabe, Nirasaki (JP); Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 12/057,511

(22) Filed: Mar. 28, 2008

(65) Prior Publication Data

US 2008/0238463 A1 Oct. 2, 2008

(30) Foreign Application Priority Data

Mar. 30, 2007 (JP) ............................. 2007-095546

(51) Int. Cl.
*G01R 1/067* (2006.01)

(52) U.S. Cl. .................. 324/758; 324/754; 324/765

(58) Field of Classification Search .................. None
See application file for complete search history.

(56) References Cited

U.S. PATENT DOCUMENTS 4,786,867 A * 11/1988 Yamatsu ................. 324/758
5,640,101 A * 6/1997 Kuji et al. ................ 324/754
5,742,173 A * 4/1998 Nakagomi et al. .......... 324/758
6,906,542 B2 * 6/2005 Sakagawa et al. .......... 324/754
7,501,843 B2 * 3/2009 Takahashi et al. .......... 324/758

* cited by examiner

*Primary Examiner*—Vinh P Nguyen
(74) *Attorney, Agent, or Firm*—Oblon, Spivak, McClelland, Maier & Neustadt, L.L.P.

(57) ABSTRACT

A probe apparatus for sequentially testing electrical characteristics of chips includes an imaging unit for capturing images of the electrode pads of the inspection substrate, and a unit for calculating contact positions at which the probes are expected to contact with the electrode pads. The probe apparatus further includes a storage unit for storing correction data in which reference points on a reference substrate are associated with correction amounts corresponding to differences between actual and calculated contact positions of the reference points, and a unit for obtaining actual contact positions for the electrode pads by measuring relative positions of the electrode pads with respect to the reference points and correcting the calculated contact positions of the electrode pads based on the relative positions and the correction data.

9 Claims, 17 Drawing Sheets

FIG.4

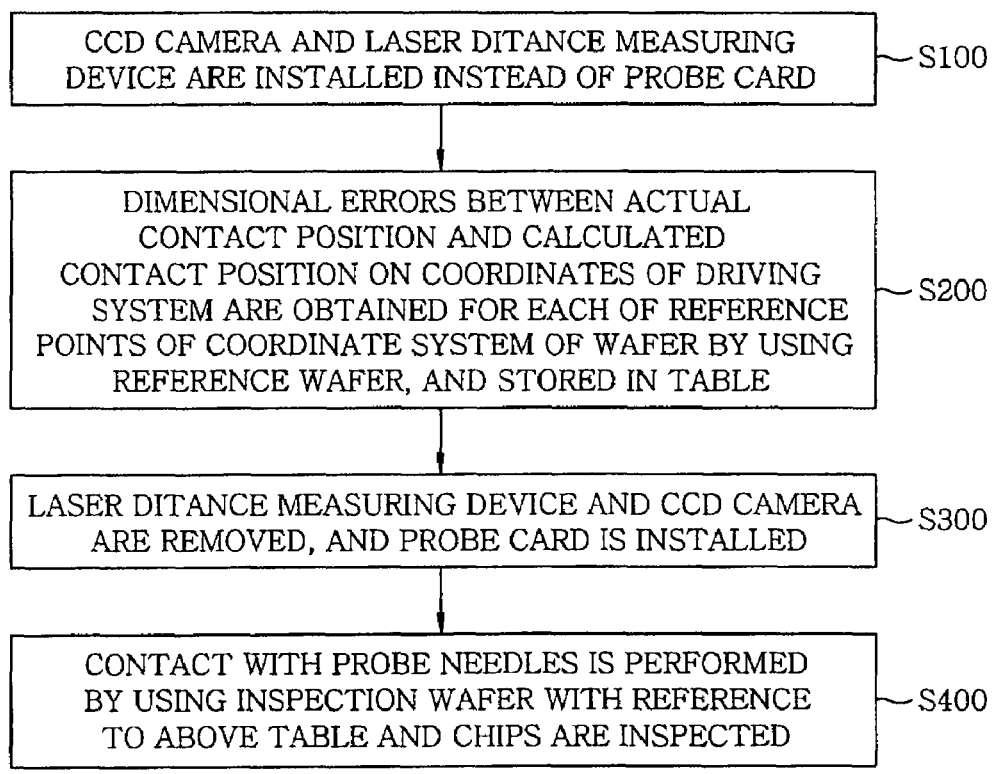

- S100: CCD CAMERA AND LASER DITANCE MEASURING DEVICE ARE INSTALLED INSTEAD OF PROBE CARD
- S200: DIMENSIONAL ERRORS BETWEEN ACTUAL CONTACT POSITION AND CALCULATED CONTACT POSITION ON COORDINATES OF DRIVING SYSTEM ARE OBTAINED FOR EACH OF REFERENCE POINTS OF COORDINATE SYSTEM OF WAFER BY USING REFERENCE WAFER, AND STORED IN TABLE
- S300: LASER DITANCE MEASURING DEVICE AND CCD CAMERA ARE REMOVED, AND PROBE CARD IS INSTALLED
- S400: CONTACT WITH PROBE NEEDLES IS PERFORMED BY USING INSPECTION WAFER WITH REFERENCE TO ABOVE TABLE AND CHIPS ARE INSPECTED

FIG.5

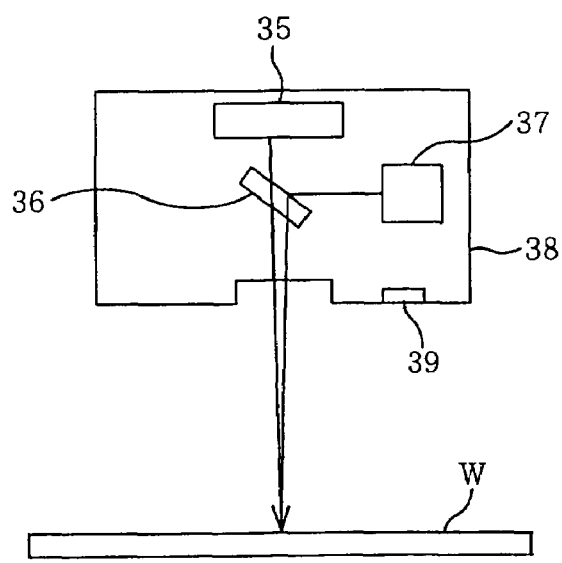

| REFERENCE POINTS | CORRECTION AMOUNT | | |
|---|---|---|---|
| | ΔX(μm) | ΔY(μm) | ΔZ(μm) |
| M1 | +5 | −1 | −1 |
| M2 | +6 | −3 | −3 |
| M3 | +4 | −4 | −6 |
| M4 | +2 | −5 | −5 |
| ⋮ | ⋮ | ⋮ | ⋮ |
| Mn | | | |

IDEAL COORDINATES OF REFERENCE WAFER

CORRECTION AMOUNTS IN Z DIRECTION OF CONTACT POSITIONS

IDEAL COORDINATES
OF REFERENCE WAFER

CORRECTION AMOUNTS IN Z DIRECTION
OF CONTACT POSITIONS

PROBE APPARATUS AND METHOD FOR MEASURING ELECTRICAL CHARACTERISTICS OF CHIPS AND STORAGE MEDIUM THEREFOR

FIELD OF THE INVENTION

The present invention relates to a technical field of a probe apparatus for testing electrical characteristics of chips to be inspected while contacting electrode pads of the chips to be inspected with probes of a probe card by moving a mounting table which mounts thereon an inspection substrate on which the chips to be inspected are arranged in column-wise and row-wise.

BACKGROUND OF THE INVENTION

After IC chips are formed on a semiconductor wafer (hereinafter, referred to as "wafer"), a probe test is performed on the wafer itself by using a probe apparatus in order to test electrical characteristics of the IC chips. The probe apparatus is constructed to control a position of a mounting table for mounting the wafer thereon capable of moving in X, Y and Z directions and rotating about a Z axis so that probes, e.g., probe needles, of a probe card are brought into contact with electrode pads of the IC chips of the wafer, the probe card being provided above the mounting table which mounts thereon the wafer.

A driving unit of the mounting table includes ball screws forming X, Y and Z axes and motors for driving the ball screws, and the position of the mounting table is controlled based on the number of pulses of an encoder attached to each motor. Therefore, the mounting table moves on coordinates of a driving system managed based on the number of pulses of the encoder. The contact position between the electrode pads of the wafer and the probe needles on the coordinates of the driving system can be calculated by photographing specific points on the wafer with a camera and obtaining a relationship among the position of the camera, the position of the mounting table in the photographing operation and the positions of the probe needles.

In practice, however, it is extremely difficult that the calculated contact position on the coordinates of the driving system coincide with the actual contact position by the effects of processing accuracy of the ball screws, distortion of the ball crews, right-left vibration or forward-backward inclination of a mechanism for guiding movement of the mounting table on an XY plane, inclination around peripheries of the ball screws, and further by the effects of extension and contraction of the ball screws and the like.

To that end, Patent Document 1 suggests a method for contacting probe needles with electrode pads by considering distortion of ball screws based on images of the probe needles captured by a camera provided at a mounting table and those of a wafer on the mounting table captured by a camera capable of moving inside an apparatus. In this method, positions of the probe needles and those of the electrode pads can be made effectively obtained as if they are recognized by a single camera by aligning optical axes of both cameras. The probe needles and the electrode pads are made to contact each other based on the imaging result and by considering the distortion of the ball screws and the like. Further, in this method, the alignment is carried out by considering a relationship between wafer coordinates (coordinates specified by arrangement of chips) and coordinates of the driving system by obtaining a relationship between the number of pulses of each encoder and the actual distance between two specific points respectively set in the horizontal and vertical directions in an area where chips are arranged. As a result, X, Y and Z coordinates of contact positions of points other than the specific points can be estimated.

Patent Document 2 describes a method for obtaining coordinate correction information indicating a relationship between ideal stage coordinates in an X-Y coordinate system which contain no misalignment and actually measured stage coordinates in an X-Y coordinate system which contain misalignment due to distortion of a stage at each of a plurality of reference points on a wafer that is mounted on the mounting table to be used in correcting coordinates. According to the entire disclosure of Patent Document 2, it may be possible that by employing this method, a contact position in the X and Y directions can be calculated with high accuracy by aligning the wafer to be inspected based on the coordinate correction information. Moreover, it may be also possible that in the method of Patent Document 1, X and Y coordinates of a contact position can be simply and precisely calculated based on such pre-obtained coordinate correction information. Further, in Patent Document 2, the Z direction is not considered at all.

FIG. 20A shows an ideal case that a surface of a wafer 900 is uniformly flat. In this case, if a Z position of a random point at which a wafer 900 contacts with a probe needle 904 is precisely obtained, the measurement can be stably performed even in other positions, i.e., electrode pads 901 and 902, by moving a mounting table 903 to the Z position. On the contrary, FIG. 20B describes a case that a surface of the mounting table is bent or a wafer surface seen from the probe needle is bent by the distortion of ball screws or the like. In such cases, a proper Z position (height position) at which the electrode pad 901 or 902 contacts with the wafer changes. Therefore, in order to stably measure all the IC chips on the wafer, the Z position needs to be properly set in each of the electrode pads.

Meanwhile, as an electrode pad becomes scaled-down, a dimension of about 40 μm×40 μm is being examined. The miniaturization of the electrode pad leads to a demand for higher accuracy in a height position at which the electrode pad and a needle tip contact with each other. Namely, after the wafer is aligned, the high accuracy of a Z coordinate as well as X and Y coordinates is required at a calculated contact position between probe needles and electrode pads. The reason is as follows.

After the probe needles and the electrode pads are brought into contact with each other, the mounting table is slightly raised. Accordingly, a so-called overdrive is applied, and the probe needles penetrate into the electrode pads. At this time, if the probe needles are horizontal probe needles, the probe needles are bent, and needle tips thereof are restored horizontally by the restoration force, thereby cutting a native oxide film on the surface of the electrode pads. Thus, if an overdrive is applied due to the error of the calculated coordinate of the contact position when the probe needles and the contact electrode pads are brought into contact with each other before the original overdrive is applied, the needle tips are already slightly bent at that moment. Accordingly, when the actual overdrive is applied at the position, the needle tips are deviated from the electrode pads.

Even for the case of vertical needles, a method is considered in which the needle tips thereof are made to slip when the overdrive is applied and the above problems are also encountered. Besides, the vertical needles require high accuracy of the Z coordinate of the original contact position regardless of whether the needles tips are made to slip or not. The reason is as follows. When an overdrive is already applied in the contact operation, the electrode pads are damaged by the needle tips when the intended over drive is applied. Accordingly, a large force is applied in a vertical direction to the vertical needles and, hence, the needles are bent, or the probe card becomes crooked. On the contrary, if the needle tips are slightly separated from the electrode pads in the contact operation, the intended overdrive is not applied sufficiently when actually applying the overdrive and, thus, the electrode pads are not damaged by the needle tips. For these reasons, an extremely high accuracy is required for fabricating the needle tips of the vertical needles. And thus, there arises a demand for easing such fabricating conditions.

The accuracy of the contact position in the Z direction cannot be guaranteed by the methods described in Patent Documents 1 and 2.

Patent Document 1: Japanese Patent Laid-open Application No. H7-297241

Patent Document 2: Japanese Patent No. 3725314: claim 1, FIGS. 3 to 5

SUMMARY OF THE INVENTION

In view of the above, the present invention provides a technique for contacting probes with electrode pads of chips to be inspected on an inspection substrate in a probe apparatus while aligning the probes and the electrode pads in a height direction with high accuracy.

In accordance with a first aspect of the present invention, there is provided a probe apparatus for sequentially measuring electrical characteristics of chips to be inspected by contacting electrode pads of the chips with probes of a probe card by moving a mounting table which mounts thereon an inspection substrate, wherein the chips are arranged column-wisely and row-wisely on the inspection substrate, and the mounting table is movable in X, Y and Z directions by a driving unit, the probe apparatus including: an imaging unit for capturing images of the electrode pads on the inspection substrate mounted on the mounting table or those of specific points on the mounted inspection substrate, each specific point having a specific positional relationship with an electrode pad; and means for calculating, based on a captured result of the imaging unit, contact positions in the X, Y and Z directions on coordinates of a driving system managed by the driving unit, wherein the probes are expected to contact with the electrode pads of the inspection substrate mounted on the mounting table at the contact positions.

The apparatus further includes: a storage unit for storing correction data obtained in advance by using a reference substrate differing from the inspection substrate, wherein in the correction data, reference points on the reference substrate are associated with correction amounts corresponding to differences in the X, Y and Z directions between actual contact positions for the reference points and contact positions on the coordinates of the driving system calculated by using a captured result of the reference points by the imaging unit; and means for obtaining actual contact positions by obtaining relative positions of the electrode pads of the inspection substrate with respect to the reference points and correcting the contact positions calculated by the calculating means based on the relative positions and the correction data stored in the storage unit.

Preferably, the reference points are positioned to correspond to grid points obtained by dividing the reference substrate in a grid pattern, and the means for obtaining the actual contact positions obtains a position in the Z direction of an electrode pad of the inspection substrate by treating the electrode pad to be on a plane formed by three reference points among four reference points forming a single grid.

The probing apparatus may further include an imaging member for capturing images of the probes, the imaging member being provided at a portion moving together with the mounting table in the X, Y and Z directions.

The calculating means may calculate the contact positions based on the captured result of the imaging unit, a captured result of the imaging member, and a position in the X, Y and Z directions on the coordinates of the driving system which are obtained when optical axes of the imaging unit and the imaging member are aligned.

In accordance with a second aspect of the present invention, there is provided a probing method for sequentially measuring electrical characteristics of chips to be inspected by contacting electrode pads of the chips with probes of a probe card by moving a mounting table which mounts thereon an inspection substrate, wherein the chips are arranged column-wisely and row-wisely on the inspection substrate and the mounting table is movable in X, Y and Z directions by a driving unit, the probing method including: (a) capturing, by using an imaging unit, images of the electrode pads on the inspection substrate mounted on the mounting table or those of specific points on the mounted inspection substrate, each specific point having a specific positional relationship with an electrode pad; and (b) calculating, based on a captured result of the imaging unit, contact positions in the X, Y and Z directions on coordinates of a driving system managed by the driving unit, wherein the probes are expected to contact with the electrode pads of the inspection substrate mounted on the mounting table at the contact positions.

The method further includes: (c) obtaining relative positions in the X and Y directions of the electrode pads of the inspection substrate with respect to a plurality of reference points on a reference substrate differing from the inspection substrate; and (d) obtaining actual contact positions by correcting the calculated contact positions obtained in the step (b) based on the relative positions obtained in the step (c) and correction data obtained in advance by using the reference substrate, wherein in the correction data the reference points on the reference substrate are associated with correction amounts corresponding to differences in the X, Y and Z directions between actual contact positions for the reference points and contact positions on the coordinates of the driving system calculated by using a captured result of the reference points by the imaging unit.

In accordance with a third aspect of the present invention, there is provided a storage medium storing a computer program for use in a probe apparatus for sequentially measuring electrical characteristics of chips to be inspected by contacting electrode pads of the chips with probes of a probe card by moving a mounting table which mounts thereon an inspection substrate, wherein the chips are arranged column-wisely and row-wisely on the inspection substrate, and the mounting table is movable in X, Y and Z direction by a driving unit, wherein the computer program is designed to perform the probing method described above.

In accordance with embodiments of the present invention, there is used correction data in which a plurality of reference points on the reference substrate different from the inspection substrate are associated with the correction amounts corresponding to differences in the X, Y and Z directions between the actual contact position and the calculated contact position on the coordinates of the driving system based on the images of the reference points captured by the imaging unit. Accordingly, it is possible to contact the probes with the electrode pads of the chips to be inspected on the inspection substrate while aligning the probes and the electrode pads in a height direction with high accuracy.

BRIEF DESCRIPTION OF THE DRAWINGS

The objects and features of the present invention will become apparent from the following description of embodiments, given in conjunction with the accompanying drawings, in which:

FIG. 4 presents a flow chart of an entire sequence of a probing method of the present invention;

FIG. 5 schematically shows an example of a distance measuring unit used in the probing method;

DETAILED DESCRIPTION OF THE EMBODIMENT

Hereinafter, embodiments of the present invention will be described with reference to the accompanying drawings which form a part hereof.

[Configuration of Apparatus]

Figure 1:
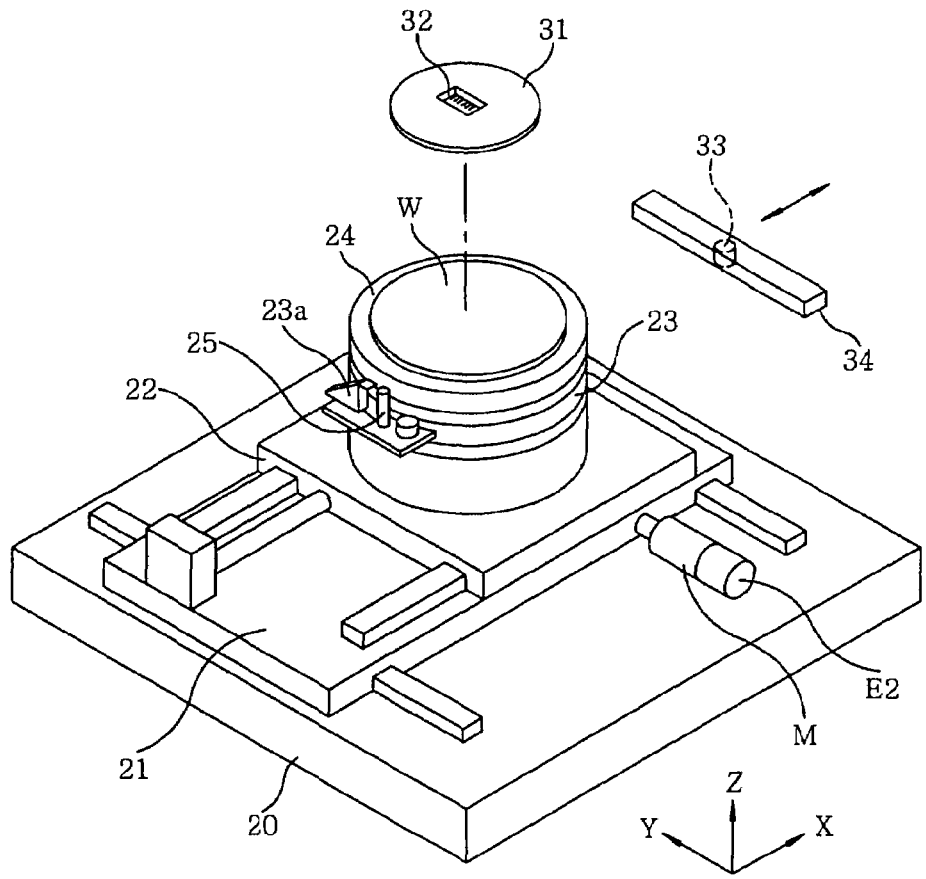
FIG. 1 is a schematic perspective view of an entire configuration of an example of a probe apparatus of the present invention.

A probe apparatus 1 used in a probing method of the present invention will be described with reference to FIGS. 1 and 2. The probe apparatus 1 includes a base table 20. Provided on the base table 20 are a Y stage 21 driving in a Y direction by, e.g., ball screws or the like, along a guide rail extending in the Y direction and an X stage 22 driving in an X direction by, e.g., ball screws or the like, along a guide rail extending in the X direction. The X stage 22 and the Y stage 21 are provided with respective motors. A notation M indicates a motor of the X stage 22, and E2 represents an encoder combined with the motor M. However, a motor and an encoder of the Y stage 21 are not shown in FIG. 1.

Provided on the X stage 22 is a Z moving unit 23 moving in a Z direction by a motor (not shown) combined with an encoder (not shown). The Z moving unit 23 is provided with a wafer mounting table 24 capable of rotating about a Z-axis (capable of moving in a θ direction). Therefore, the wafer mounting table 24 can move in the X, Y, Z and θ directions. The X stage 22, the Y stage 21 and the Z moving unit 23 form a driving unit.

A probe card 31 is disposed above the wafer mounting table 24, and is attached to a head plate 51 corresponding to a ceiling portion of a casing of the probe apparatus 1 via an insert ring 52. Further, the probe card 31 has on a top surface thereof a group of electrodes electrically connected with a test head (not illustrated). Provided on a bottom surface of the probe card 31 are probes, e.g., probe needles 32, electrically connected with the group of electrodes. The probe needles 32 are made of, e.g., metal wire extending downward slantingly, and are disposed correspondingly to the arrangement of the electrode pads of the wafer W. As for a probe, there may be used a vertical needle (wire probe needle) extending in perpendicular to a surface of the wafer W, a gold bump electrode formed on a flexible film or the like.

Figure 2:
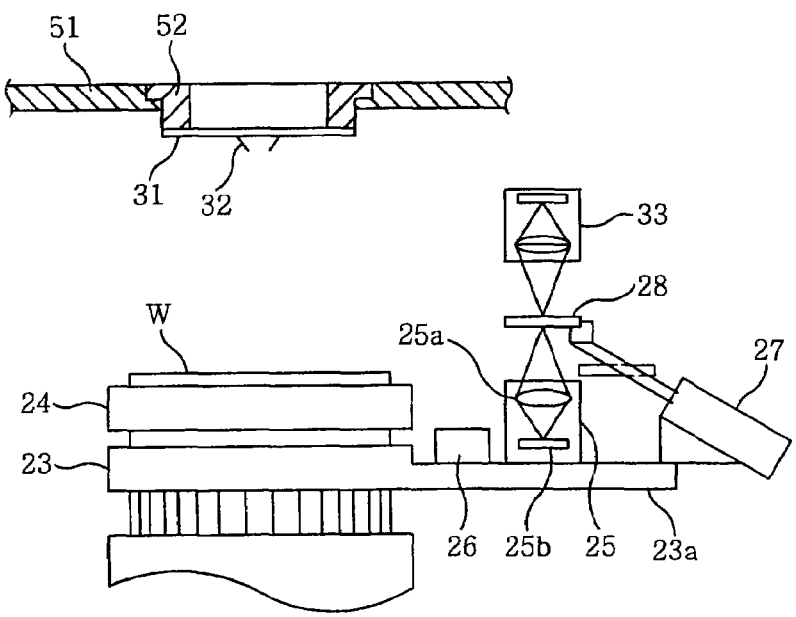
FIG. 2 describes a schematic view of the example of the probe apparatus.

As illustrated in FIG. 2, a first imaging unit 25 serving as a lower camera is fixed to the Z moving unit 23 via a fixing plate 23a. The first imaging unit 25 includes an optical system 25a and a CCD camera 25b of high magnification so as to capture enlarged images of needle tips of the probe needles 32. Further, a camera 26 of low magnification is fixed near the first imaging unit 25 to capture an image of the arrangement of the probe needles 32 in a wider area. In addition, a target 28 is provided on the fixing plate 23a so that it can move back and forth by a reciprocating mechanism 27 in a direction crossing an optical axis of the first imaging unit 25 at a plane on which the first imaging unit 25 focuses.

In an area between the wafer mounting table 24 and the probe card 31, a second imaging unit 33 serving as an upper camera including a CCD camera and an optical unit is fixed to a moving body 34, and is provided to be movable in the X direction along a guide (not shown). Moreover, it is constructed so that an image of the target 28 can be recognized by the first imaging unit 25 and the second imaging unit 33. For example, the target 28 has a structure in which a circular metal film as a subject for alignment, e.g., a metal film having a diameter of about 140 μm, is deposited on a transparent glass plate.

Figure 3:
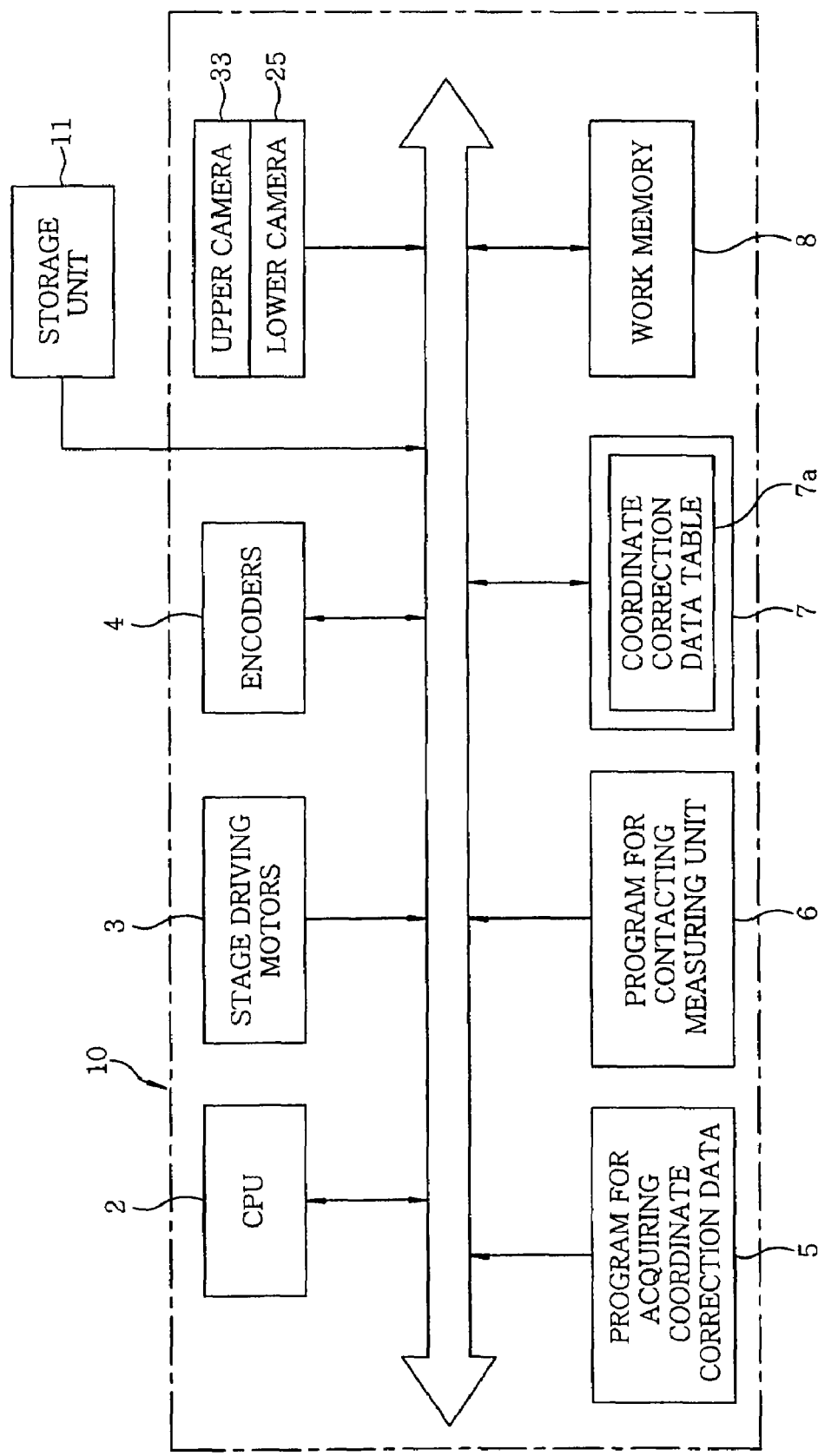
FIG. 3 schematically illustrates an example of a control system of the probe apparatus.
Figure 6:
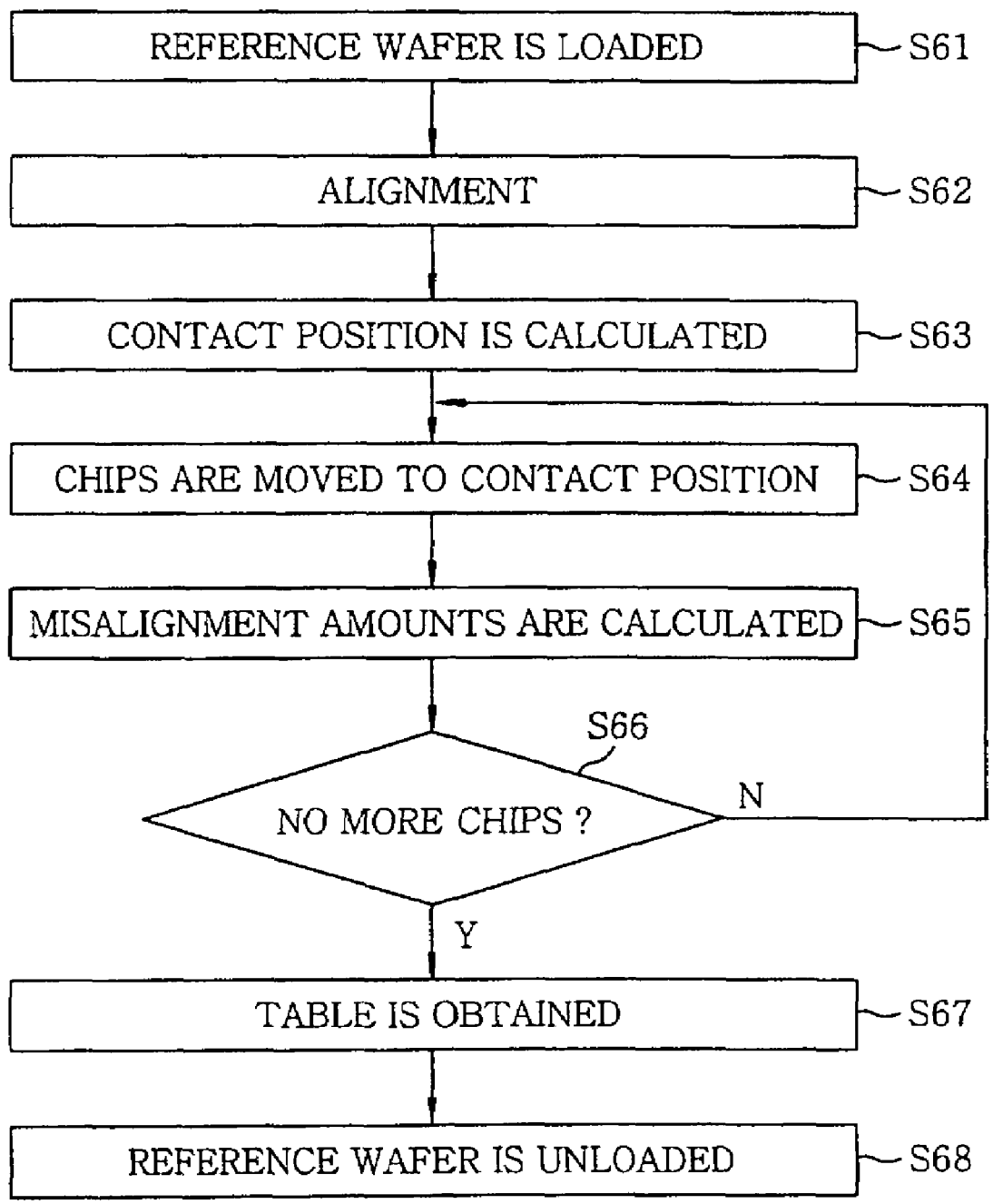
FIG. 6 represents a flow chart depicting a sequence of acquiring a correction value by using a reference wafer.
Figure 7:
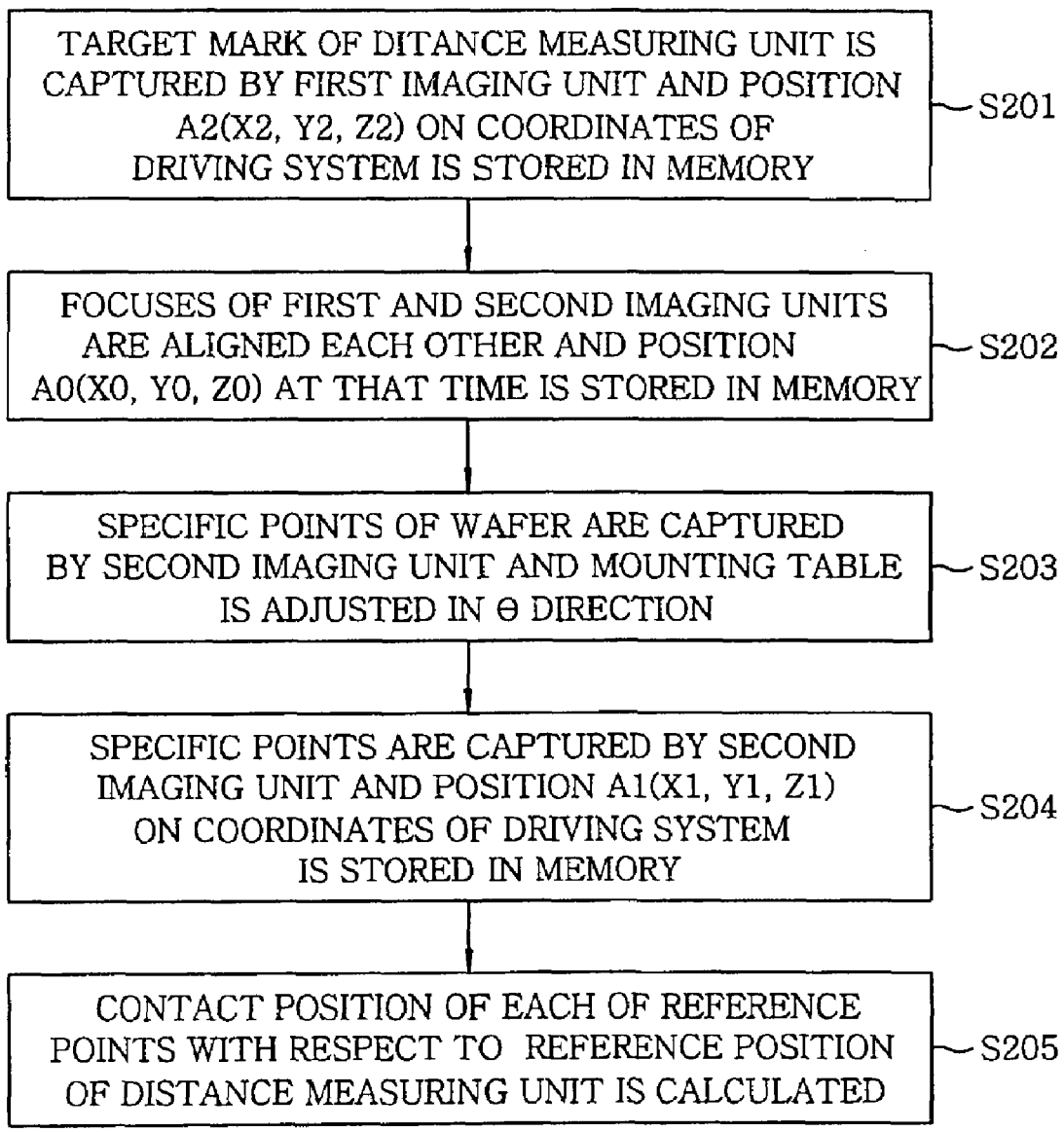
FIG. 7 provides a flow chart of an alignment process in the reference wafer.

FIG. 3 depicts principal parts of a control unit 10 used in the probe apparatus 1 of this embodiment. A reference numeral 2 indicates a CPU, which controls overall operation of the control unit 10. A reference numeral 3 represents stage driving motors including the motors of FIG. 1. A reference numeral 4 indicates encoders respectively provided on the X motor, the Y motor and the Z motor. A reference numeral 5 represents a program for acquiring coordinate correction data by using a reference wafer to be described later, and corresponds to a unit for calculating a contact position which will be described in claims. Although the operation executed by the program 5 can be generally performed by a manufacturer of the probe apparatus 1, it is assumed, for convenience of explanation, that the program 5 is installed in the control unit 10.

Further, the control unit 10 has a program 6 for contacting an inspection wafer on which electrical characteristics inspection is carried out while having the probe needles 32 to contact with electrode pads formed on a surface of the inspection wafer. The program 6 corresponds to a unit for obtaining an actual contact position which will be described in claims. A reference numeral 7 indicates a memory, which stores therein a coordinate correction data table 7a to be described later. A reference numeral 8 represents a work memory for executing an operation or the like based on the data read from the memory 7 or the like. The programs 5 and 6 (including programs for manipulating input or display of processing parameters) are stored in a storage unit 11, i.e., a computer storage medium such as a flexible disk, a compact disk, an MO (magneto-optical) disk, a hard disk or the like, and are installed in the control unit 10.

[Entire Sequence]

FIG. 4 illustrates an entire sequence of processes performed in this embodiment. Steps S100, S200 and S300 correspond to, e.g., pre-treatment operations executed by the manufacturer of the probe apparatus 1. In order to control the contact between the probe needles and the electrode pads on the wafer W in this probe apparatus 1, images of the probe needles 32 and the wafer W are captured by a camera facing upward (the first imaging unit 25) and a camera facing downward (the second imaging unit 33). Next, a contact position at which the electrode pads are expected to contact with the probe needles 32 is calculated based on the captured images and, then, the motor 3 is driven based on the calculated contact position, thereby contacting each other. Since, however, the calculated contact position is not a position obtained by actually having the electrode pads to contact with the probe needles 22, there is a difference at a micro level between the calculated position and the actual position. That is because the area where the alignment is carried out by using the cameras (the first imaging unit 25 and the second imaging unit 33) is different from the area where the probe needles 32 are disposed. The pre-treatment operations are performed in order to check the difference between the calculated position and the actual position.

First of all, in a step S100, a CCD camera 35 and a laser distance measuring machine 37 are installed, instead of the probe card 31, at an insert ring 52. As shown in FIG. 5, the CCD camera 35 and the laser distance measuring machine 37 are constructed so that both of them focus on a same point on the wafer W via a half mirror 36, and are integratedly provided as a distance measuring unit 38 with a half mirror 36. The distance measuring unit 38 is for measuring an actual Z coordinate of a reference wafer W1 mounted on the wafer mounting table 24. The reference wafer W1 will be described later. Further, a target mark 39 is attached to a specific position on a bottom surface of the distance measuring unit 38 (surface facing the wafer W).

The step S200 following the step S100 is executed by using the reference wafer W1 having on a surface thereof, e.g., a plurality of chips and a plurality of reference points formed in a precise matrix pattern. Hereinafter, a key point of the pre-treatment operations will be explained in detail. The X, Y and Z coordinates of the calculated contact position on the coordinates of the driving system (coordinates managed by the pulses of the encoders 4 of the motors 3) with respect to each reference point on the reference wafer W1 are obtained by performing alignment to be described later, and the reference wafer W1 is moved so that the reference points thereon are placed on the contact positions.

Further, each contact position in this step is a position which is precisely known in X, Y, Z directions with respect to the target mark 39 of the distance measuring unit 38, and also corresponds to a virtual contact position captured by the CCD camera 35 and measured by the laser distance measuring machine 37. Moreover, the dimensional errors in the X, Y and Z directions between the calculated contact positions and the actual contact positions can be obtained by measuring X and Y coordinates based on the images of the reference points captured with the use of the CCD camera 35 and also by obtaining actual height positions, i.e., distances to the reference points, with the use of the laser distance measuring machine 37. Accordingly, the correction amounts for each of the reference points which are required for obtaining the actual contact position from the calculated contact position can be obtained by dividing the errors by the moving distances per one pulse of the encoders.

The correction amounts for each of the reference points are stored in the table 7a. To perform a contact operation between an inspection wafer W2 serving as an inspection substrate and the probe needles 32, calculated contact positions, at which the electrode pads of the inspection pads are expected to contact with the probe needle 32, are obtained first by performing the alignment on the electrode pads of the inspection wafer W2; and, then, correction amounts corresponding to the electrode pads can be obtained by checking which of the reference points of the reference wafer W1 correspond to the electrodes pads. Thus, the actual contact positions are obtained by adding the correction amounts to the calculated contact positions, and the precise contact operation can be carried out by driving the motor 3 based on the actual contact positions. Steps S300 and S400 describe these operations performed on the inspection wafer W2.

In the step S300, the distance measuring unit 38 installed in the step S100 is removed, and the probe card 31 is installed. Next, in the step S400, the alignment same as that performed on the reference wafer W1 by using the first and the second imaging units 25 and 33 is performed on the inspection wafer W2 and contact positions are corrected as described above. Then, specific electrical signals are applied from an electrode unit (not shown) provided at the probe card 31 while having the probe needles 32 to contact with the electrode pads on the measuring wafer W2, thereby inspecting electrical characteristics of the inspection wafer W2.

At this time, in order to correct the contact position of the inspection wafer W2, it is required to check which of the reference points on the reference wafer W1 correspond to the positions of the electrode pads on the inspection wafer W2. If the inspection wafer W2 is the same wafer as the reference wafer W1, and if they are positioned in the same location so that the reference points on the reference wafer W1 coincide with specific points on the measuring wafer W2, the table 7a can be used without modification for the contact operation for the inspection wafer W2. In practice, however, such coincidence would not occur. Therefore, it is required to check which of the reference points of the reference wafer W1 corresponds to each point on the inspection wafer W2, or to determine how to apply the correction amounts of the reference points when the points on the inspection wafer W2 do not coincide with the reference points on the reference wafer W1 (in most cases). Hereinafter, a state of the pretreatment, a specific method of the alignment, a method for calculating the correction amount and the like will be described.

[Acquisition of Coordinate Correction Data]

Figure 13A:
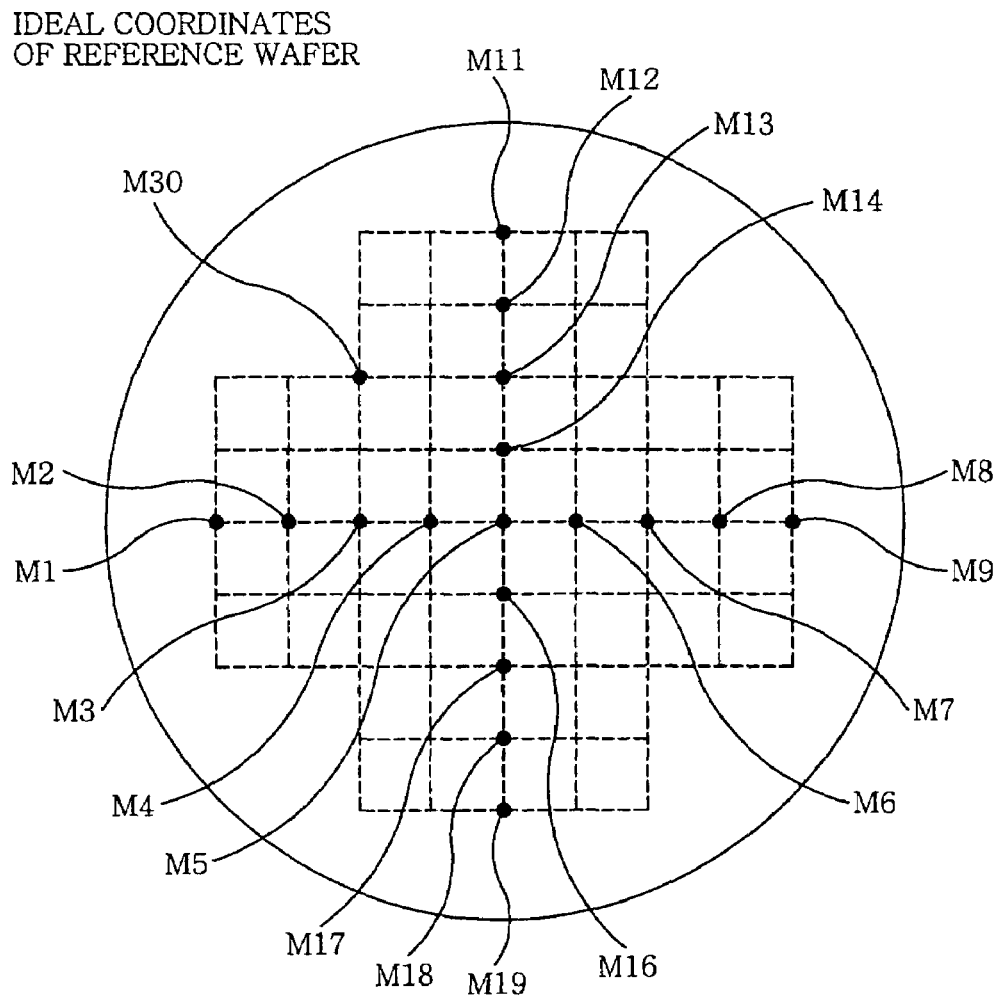
FIGS. 13A and 13B schematically show the correction values.

A process for acquiring correction data (corresponding to the step S200 in FIG. 4) by using the reference wafer W1 will be described in detail with reference to FIGS. 6 to 13. First of all, the reference wafer W1 is mounted (loaded) on the wafer mounting table 24 by using a transfer unit (not illustrated) (step S61). As is schematically shown in FIG. 13A, on the surface of the reference wafer W1, a plurality of reference points formed in column-wise and row-wise and spaced from each other at equal intervals are positioned to correspond to grid points obtained by dividing the wafer surface in, e.g., a square-shaped grid pattern. To be more specific, the reference wafer W1 has thereon IC chips formed in column-wise and row-wise, and specific electrode pads on the IC chips are set as reference points. Further, the reference wafer W1 is aligned by using the first imaging unit 25 and the second imaging unit 33. Although the alignment is performed in the same manner as that described in Patent Document 1, an outline thereof will be explained with reference to FIGS. 7 and 8A to 8C.

Figure 8A:
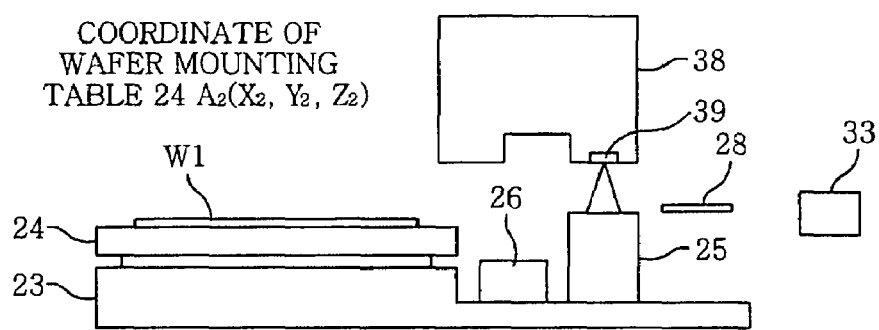
FIGS. 8A to 8C explain an operation of a probe apparatus in the alignment process.

After the wafer W1 is mounted on the wafer mounting table 24, the wafer mounting table 24 moves in the X, Y and Z directions so that the focus of the first imaging unit 25 coincides with the target mark 39 attached on the bottom surface of the distance measuring unit 38, as shown in FIG. 8A. At this time, a position A2 (X2, Y2, Z2) in the X, Y and Z directions of the wafer mounting table 24 is obtained on the coordinates of the driving system (step S201). The position of the wafer mounting table 24 on the coordinates of the driving system is a position managed by the number of pulses of the encoders in the X, Y and Z directions with respect to a specific standard position when the wafer mounting table 24 (i.e., the Z moving unit 23) is positioned at a location.

Figure 8B:
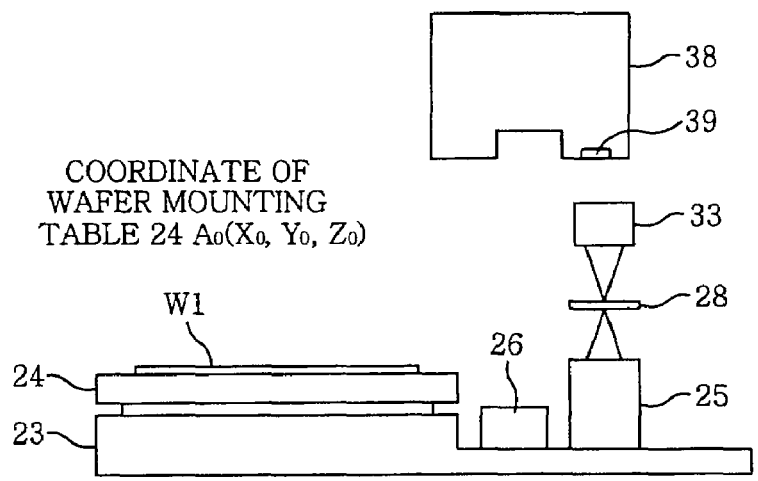

Next, the second imaging unit 33 is positioned under the probe needles 32 and, at the same time, the target 28 is forwarded to an area between the first imaging unit 25 and the second imaging unit 33, as illustrated in FIG. 8B. Thereafter, the wafer mounting table 24 is moved in the X, Y and Z directions so that the focus of the second imaging unit 33 lies on the metal film of the target 28 and also that the optical axis of the second imaging unit 33 passes through a center of the metal film.

The position control of the wafer mounting table 24 is carried out by locating the first imaging unit 25 below the stop position of the second imaging unit 33 and moving the wafer mounting table 24 in the X, Y and Z directions while comparing image data prestored in an image memory and image data obtained by the second imaging unit 33. Further, since the focus and the optical axis of the first imaging unit 25 are aligned with respect to the target 28 (specifically, a metal film), both of the imaging units 25 and 33 have the same focus and optical axis. The position in the X, Y and Z directions of the wafer mounting table 24 on the coordinates of the driving system at that time is stored as a point A0 (X0, Y0, Z0) in a memory (not illustrated) (step S202).

Figure 8C:
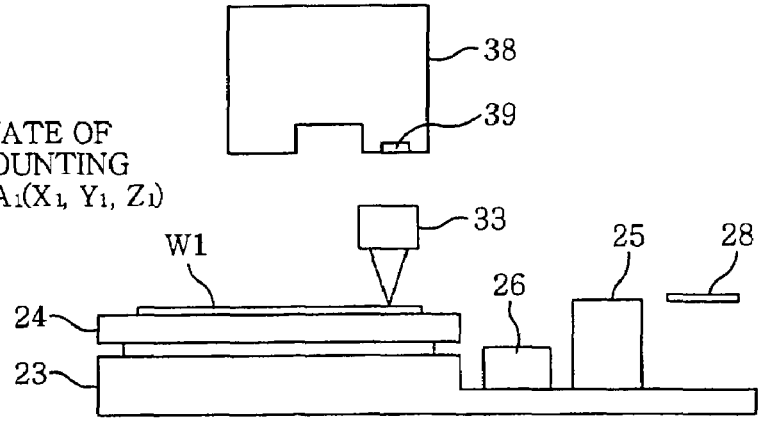

Next, as depicted in FIG. 8C, the target 28 retreats from the area above the first imaging unit 25 and, the wafer mounting table 24 is positioned below the second imaging unit 33. In that state, images of positions of five reference points of the reference wafer W1 are captured. The five reference points include a center point of the reference wafer W1, two reference points at both ends of a group of horizontally arranged reference points passing through the center point and two reference points at both ends of a group of vertically arranged reference points passing through the center point. These five points are indicated as M1, M5, M9, M11 and M19.

In order to recognize the reference points, a teaching operation is performed by storing in an image memory images obtained when the focus of the second imaging unit 33 is aligned with each of the reference points by, e.g., an operator who moves the wafer mounting table 24 while observing a CRT screen and, also by storing a moving pattern of the wafer mounting table 24. When the reference wafer W1 is measured, rough alignment is performed based on a pre-taught image and an image of a wide area on the reference wafer W1 captured by the second imaging unit 33 of a low magnification mode while moving the wafer mounting table 24 to each of the points in accordance with the pre-taught moving pattern and, then, precise alignment is carried out by capturing an image of a narrow area by the second imaging unit in a high magnification mode. Next, the mounting table 24 moves in the $\theta$ direction by obtaining the misalignment in the $\theta$ direction from, e.g., two points, among the reference points while considering the misalignment between the arrangement direction of the target mark 39 of the distance measuring unit 38 and that of the reference points (step S203). Since the direction of the reference wafer W1 is already adjusted by an alignment mechanism (not shown), the misalignment in the $\theta$ direction is extremely small.

Thereafter, the images of the five reference points are captured by the second imaging unit 33 again, and the respective positions on the coordinates of the driving system of the wafer mounting table 24, i.e., (Xa, Ya, Za), (Xb, Yb, Zb), (Xc, Yc, Zc), (Xd, Yd, Zd) and (Xe, Ye, Ze) are stored in the memory (not shown) (Step S204). For convenience, A1 (X1, Y1, Z1) is assumed to represent these positions.

By performing the above operation, it is possible to obtain the effects of capturing the images of the reference wafer W1 and the target mark 39 by a so-called common imaging unit. This is because the first imaging unit 25 and the second imaging unit 33 have the same focus. For example, when the second imaging unit 33 is the only one used, an error occurs in setting a relative position between the second imaging unit 33 and the target mark 39. However, the above alignment process makes it possible to recognize the precise relative position between the reference points of the reference wafer W1 and the target mark 39. The steps S201 to S204 correspond to the step S62 described in FIG. 6.

Next, a contact position A3 (x, y, z) of each of the reference points on the coordinates of the driving system with respect to a reference position of the distance measuring unit 38 is calculated from the points A0, A1 and A2 (step S205). This step S205 corresponds to the step S63 of FIG. 6. Namely, x, y and z are calculated as follows: x=X1+X2−X0; y=Y1+Y2−Y0; z=Z1+Z2−Z0. The contact position obtained in the process by using the reference wafer W1 is a virtual contact position captured by the CCD camera 35 and measured by the laser distance measuring device 37. Further, this contact position A3 (x, y, z) is a calculated contact position obtained by using the first and the second imaging unit 25 and 33 based on the positions of the reference points on the reference wafer W1 and the target mark 39 of the distance measuring unit 38.

The positions of the reference points on the reference wafer W1 other than the actually photographed five points can be obtained simply by dividing the positions of the five points. For example, when the coordinates of M1 and M5 are given, X and Y coordinates of M2 to M4 can be obtained by dividing a difference between the X coordinates and that between the Y coordinates of M1 and M5 by four. Moreover, Z coordinates of M2 to M4 can be obtained by dividing the Z coordinates of M1 and M5 by four. For example, if the Z coordinates of M1 and M5 are the same, M2 to M4 have the same Z coordinates. However, if there is a difference in the Z coordinates between M1 and M5, the Z coordinates of M2 to M4 can be obtained by dividing the difference by four. Namely, it is assumed that the Z coordinates of M2 to M4 are on a line segment connecting the Z coordinate of M1 and that of M5. In the same manner, if the coordinates of M11 and M5 are given, the coordinates of M12 to M14 can be obtained. In addition, coordinates of a reference point (e.g., M30) deviated from the arrangement of the above five reference points can be obtained simply by proportional calculation. Since it is possible to estimate positions of reference points, which would be obtained if they are captured by the second imaging unit 33, other than the above five points on the coordinates of the driving system, contact positions thereof on the coordinates of the driving system can be obtained by using the estimated coordinates, as in the case of the above five points.

The contact position A3 (representing all the contact positions) on the coordinates of the driving system which is calculated with respect to each of the reference points may have errors, as described above. Therefore, recalculation is performed by following steps to obtain a precise correction amount.

Figure 9:
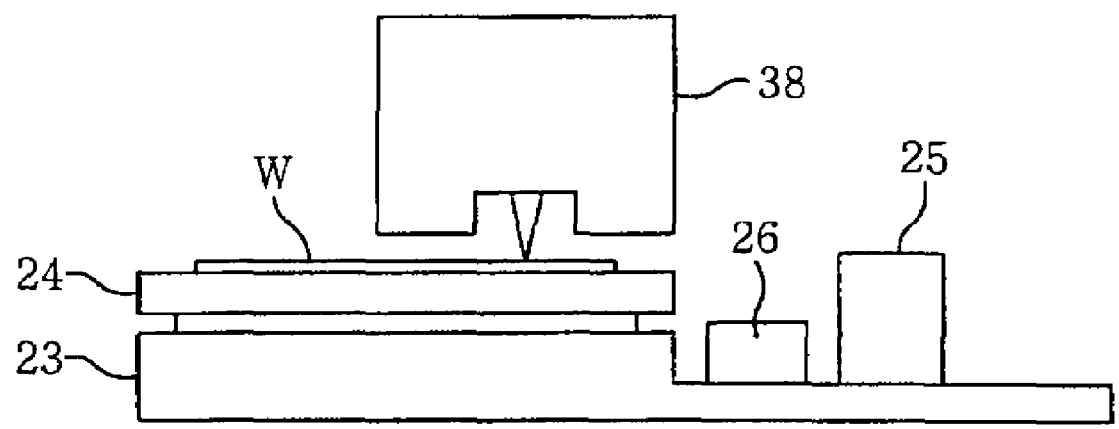
FIG. 9 explains an operation of the probe apparatus in the process for obtaining the correction value by using the reference wafer.

Namely, as shown in FIG. 9, the wafer mounting table 24 is driven to move the reference points on the reference wafer W1 to the contact position A3 (step S64). Next, the misalignment in the X and Y directions of the reference points is checked by the CCD camera 35. If there is misalignment, the wafer mounting table 24 is driven so that the misalignment can be corrected, e.g., so that a target reference point can be located on a center point of a cross mark of the viewfinder, and the driving amounts in the X and Y directions at that time are acquired. Since the center point of the cross mark is the original virtual contact position, the driving amounts in the X and Y directions correspond to the misalignment amounts between the actual contact position and the calculated contact position in the X and Y directions with respect to the corresponding reference point.

The wafer mounting table 24 is raised until the position in the Z direction (height position) of the corresponding reference point coincides with the Z coordinate of the original virtual contact position, and the driving amount of the wafer mounting table 24 at that time is obtained by the laser distance measuring device 37 (step S65). Accordingly, the misalignment amount (the correction amount) in the Z direction between the actual virtual contact position and the calculated contact position A3 is also obtained. By performing this process at other reference points, the misalignment in the X, Y and Z directions between the calculated contact position and the actual contact position is obtained at all of the reference points (step S66).

Figure 10:
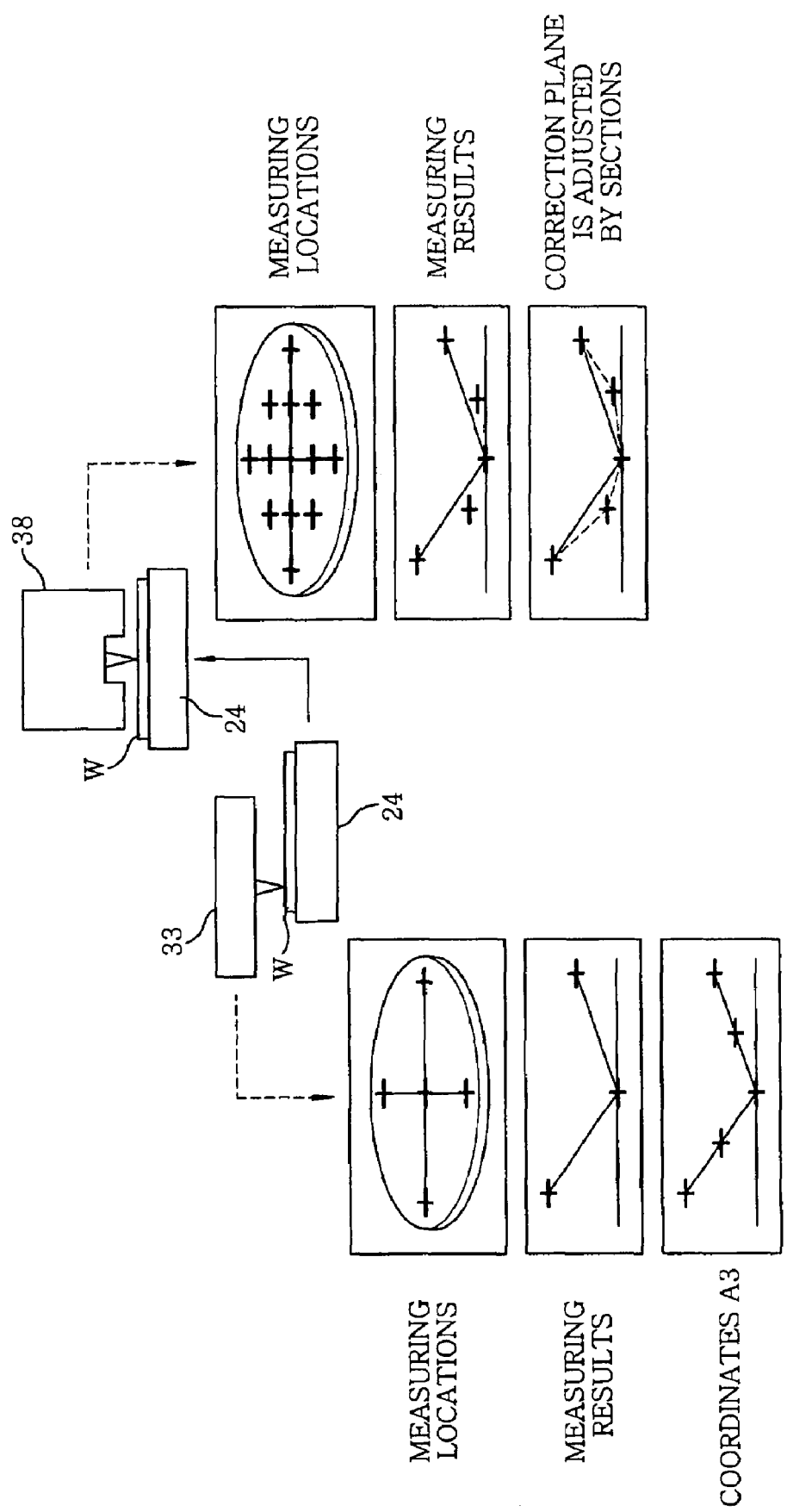
FIG. 10 is a schematic view describing a method for calculating the correction value.
Figures 11, 12:
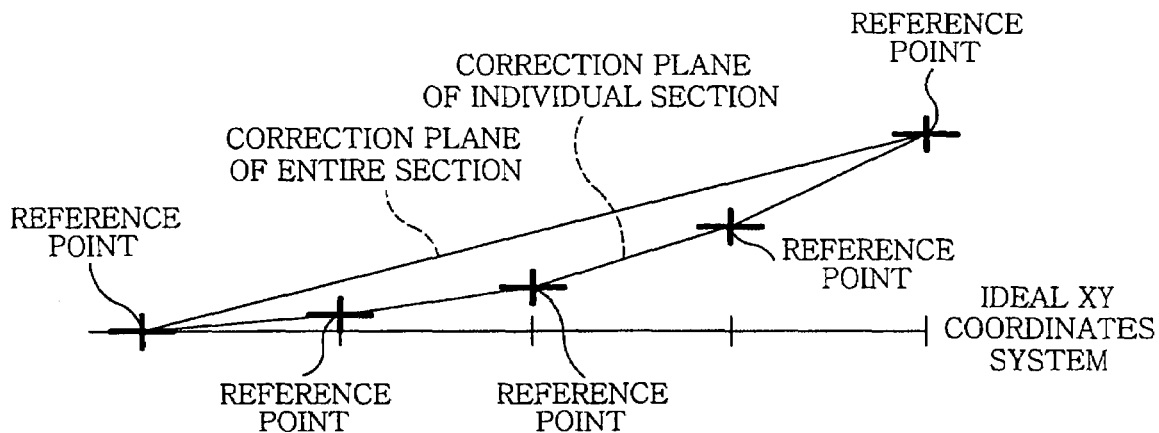
FIG. 11 schematically depicts the method for calculating the correction value.
FIG. 12 illustrates a schematic view of a table storing the correction value.

FIG. 10 shows a state where the positions of the five reference points of the reference wafer W1 on the coordinates of the driving system are obtained by capturing the image of the five reference points by the second imaging unit 33 and, then, the positions thereof are corrected in the Z direction. For example, positions in the Z direction of the reference wafer W1 between three points including the center point among the five reference points are obtained by using the positions of the three points in the Z direction. Next, actual positions in the Z direction of the respective reference points are obtained by using the CCD camera 35 and the laser distance measuring device 37. Accordingly, the misalignments between the calculated positions and the actual positions can be obtained. In calculation, positions of reference points between the three reference points are estimated by linear approximation. Therefore, misalignments are actually obtained with respect to the approximation straight line. FIG. 11 provides comparison between the case where the reference points between the three reference points are located on the straight line connecting the reference points captured by the second imaging unit 33 and the case where the Z coordinates of the respective reference points are corrected. The former case corresponds to the method of Patent Document 1, and the latter corresponds to the embodiment of the present invention.

Moreover, at each of the five reference points captured by the second imaging unit 33, the difference in the Z coordinate between the calculated virtual contact position and the actual virtual contact position is obtained. FIG. 10 does not illustrate the correction of the reference points captured by the second imaging unit 33.

The advantages of the correction in accordance with the embodiment of the present invention are schematically described in FIG. 11. When the alignment according to Patent Document 1 is carried out, other reference points that are not captured by the second imaging unit 33 are treated as being positioned on planes connecting the reference points captured by the second imaging unit 33. In the embodiment of the present invention, however, it is possible to estimate the contact positions in the Z direction of the other reference points with high accuracy.

Figure 13B:
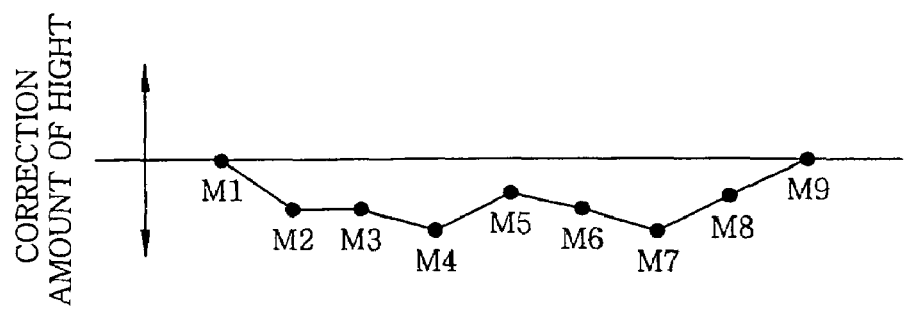

As shown in FIG. 12, the amounts of the misalignment between the actual contact position and the calculated contact position A3 obtained at each of the respective reference points are stored as the table 7a in the memory 7 (step S67). Then, the reference wafer W1 is unloaded from the wafer mounting table 24 (step S68). FIG. 13A schematically depicts the arrangement of the reference points on the reference wafer W1. The five points of M1, M11, M9, M19 and M5 correspond to the reference points captured by the second imaging unit 33. Further, FIG. 13B shows the correction amounts in the Z direction of the reference points M1 to M9.

[Inspection Using Inspection Wafer W2]

Next, electrical characteristics of the IC chips to be inspected formed on the measuring wafer W2 as an inspection substrate are tested. On a surface of the measuring wafer W2, a plurality of chips to be inspected are arranged in column-wise and row-wise and, also, specific points for acquiring coordinates are set in multiple places, e.g., in five places. The five specific points correspond to specific electrode pads on the IC chips, and include a specific electrode pad of an IC chip nearest to the center of the measuring wafer W2, specific electrode pads of IC chips at both ends of a group of horizontally arranged IC chips including the corresponding IC chip and specific electrode pads of IC chips at both ends of a group of vertically arranged IC chips including the corresponding IC chip, as in the reference wafer W1.

Figure 14:
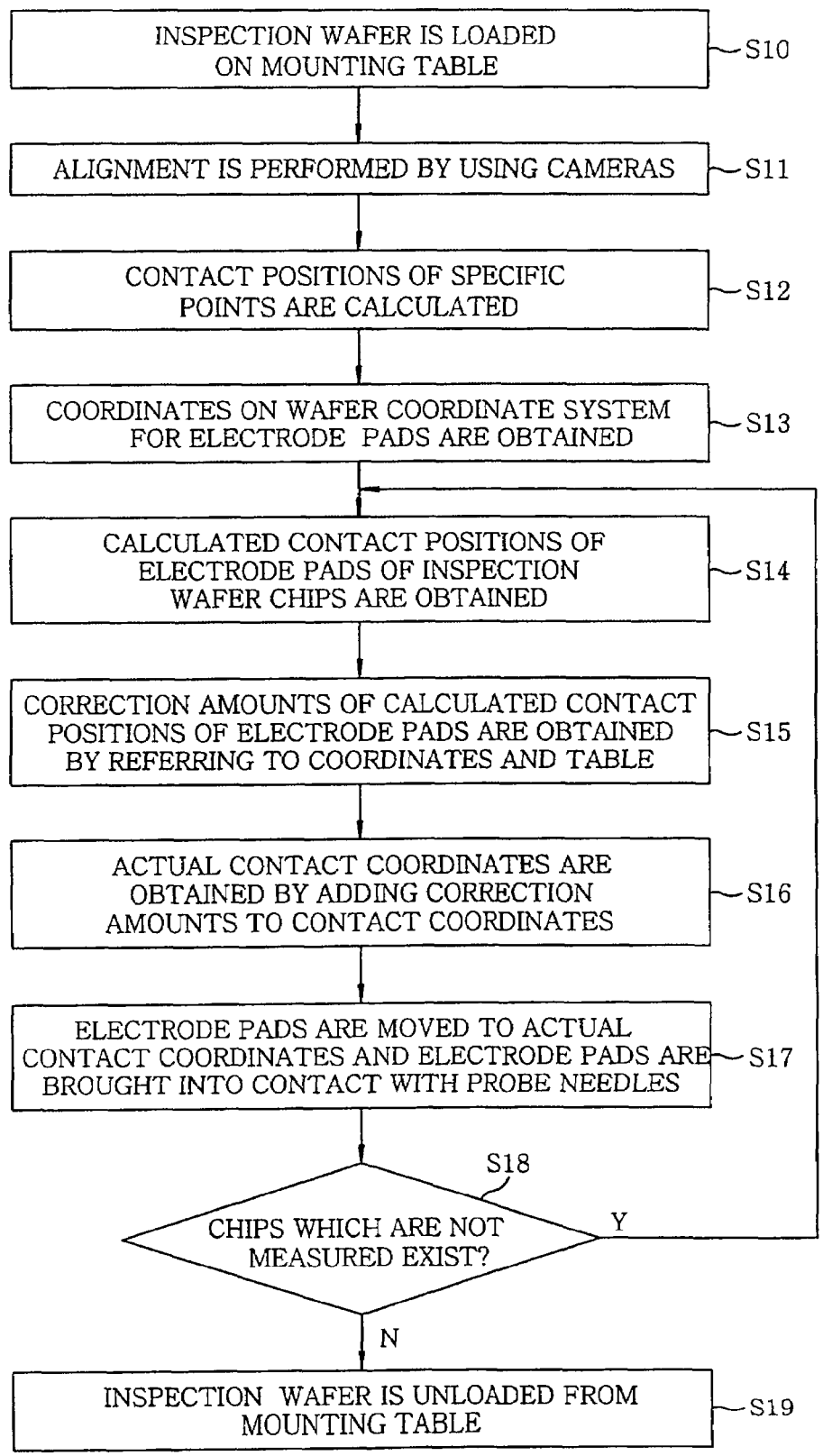
FIG. 14 provides a flow chart of a coordinate correction process performed on a measuring wafer.

As illustrated in the flow chart of FIG. 14, the wafer W2 is loaded on the wafer mounting table 24 (step S10) and, then, the alignment is performed by using the cameras (the first and the second imaging unit 25 and 33) (step S11) as in the case of the reference wafer W1 (steps S201 to S204). The alignment process will be described hereinafter.

Figure 15A:
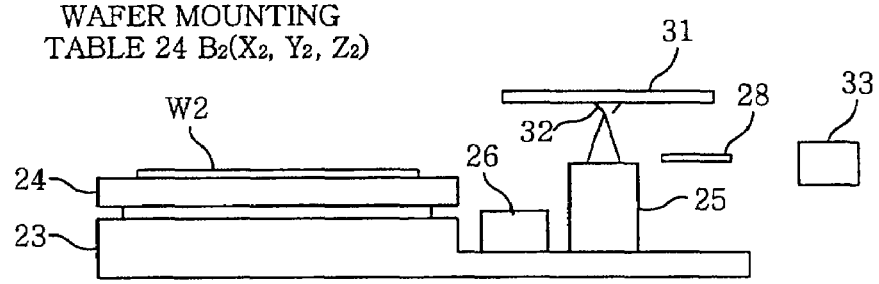
FIGS. 15A to 15C explain an operation of the probe apparatus in the coordinate correction process performed on the inspection wafer.

In this step, the probe card 31 is installed in the probe apparatus 1. Therefore, first of all, images of the probe needles 32 of the probe card 31 are captured by the first imaging unit 25, as shown in FIG. 15A, and coordinates B2 (X2, Y2, Z2) of the wafer mounting table 24 at that time are stored. As a result of the imaging process, there is acquired a position of a needle tip of a specific probe needle, e.g., a single probe needle, on the coordinates of the driving system with respect to the center point. Then, the wafer mounting table 24 is rotated so that the arrangement direction of the probe needles 32 coincides with that of the electrode pads.

Figure 15B:
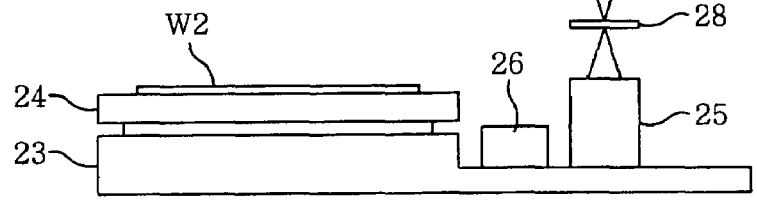

Next, the second imaging unit 33 is positioned under the probe needles 32 and, the target 28 is forwarded to an area between the first imaging unit 25 and the second imaging unit 33, as illustrated in FIG. 15B. Thereafter, the wafer mounting table 24 is moved in the X, Y and Z directions so that the focus of the second imaging unit 33 lies on the metal film of the target 28 and also that the optical axis of the second imaging unit 33 passes through a center of the metal film. The coordinates B0 (X0, Y0, Z0) at that time are stored.

Figure 15C:
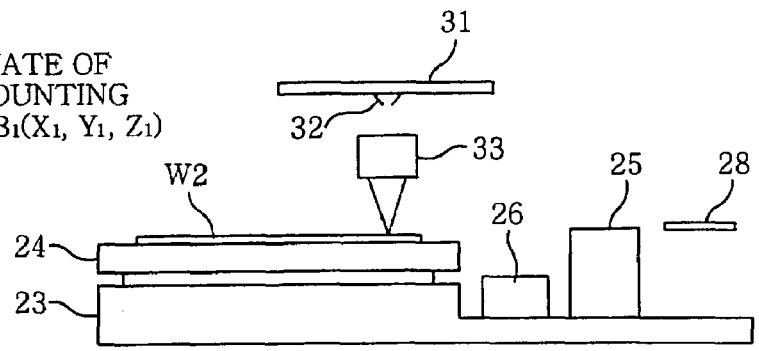

Then, as described in FIG. 15C, images of five specific points are captured by the second imaging unit 33 and positions of the five points on the coordinates of the driving system, i.e., (Xa,Ya, Za), (Xb,Yb, Zb), (Xc,Yc, Zc), (Xd,Yd, Zd) and (Xe,Ye, Ze), are obtained (for convenience, they are indicated as B1 (X1, Y1, Z1)).

Next, contact positions B3 (X2,Y3, Z3) for the five specific points are obtained as in the case of A3 of the reference wafer W1 (step S12).

Further, for all specific electrode pads among a group of electrode pads which will contact together with the probe needles 32 in the contact operations to be performed sequentially, the positions in the X and Y directions on the coordinates of the driving system are obtained, wherein the positions correspond to those which can be obtained when the specific electrodes are photographed by the second imaging unit 32. The X and Y coordinates of points (electrode pads) other than the five specific points captured by the second imaging unit 33 are obtained in the same manner as described in the case of the reference wafer W1.

The positions in the X and Y directions (X coordinate, Y coordinate) of the reference points on the reference wafer W1 which can be obtained when captured by the second imaging unit 33 are known on the coordinates of the driving system. Therefore, it is possible to obtain, by using the positions on the coordinates of the driving system, the relationship between the positions for the electrode pads of the inspection wafer W2 in the X and the Y direction on the coordinates (wafer coordinates) thereof and the positions for the reference points of the reference wafer W1 on the coordinates (wafer coordinates) thereof. Namely, it is possible to recognize the positions of the electrode pads on the inspection wafer W2 in the arranged area of the reference points of the reference wafer W1 (step S13).

Next, as described in the case of the reference wafer W1, there are obtained calculated contact positions of a specific electrode pad among a group of electrode pads of, e.g., a single IC chip, which contact together with the probe needles 32 in a first contact operation (step S14). However, the calculated contact position obtained in this case is not a specific position (the aforementioned virtual contact position) with respect to the CCD camera 35 and the laser distance measuring device 37, but the contact position of needle tip of a probe needle 32, which contacts with the specific electrode pad, among a group of the probe needles 32. This contact position approximately coincides with a virtual contact position of the reference wafer W1. Next, by referring to the coordinate correction data table 7a, the correction amounts in the X, Y and Z directions are obtained for the calculated contact position on the coordinates of the driving system (step S15). The actual contact position (X coordinate, Y coordinate, z coordinate) is obtained by adding the correction amounts to the X, Y and Z coordinates of the calculated contact position (step S16). Then, the mounting table 24 is driven toward the contact position, and the group of electrode pads is brought into contact with the group of the probe needles 32, and then the electrical characteristics are tested while applying the overdrive (step S17).

Next, the steps S14 to S17 are repetitively performed on all the electrode pads (step S18) and, then, the inspection wafer W2 is unloaded from the wafer mounting table 24 (step S19). That is, the above series of coordinate calculating operations are performed by converting the respective points on the wafer coordinates (ideal coordinates) of the inspection wafer W2 the points on the wafer coordinates (ideal coordinates) of the reference wafer W1 via coordinates of the driving system and obtaining the correction amounts in the contact positions of the respective points on the wafer coordinates of the inspection wafer W2.

Figure 16A:
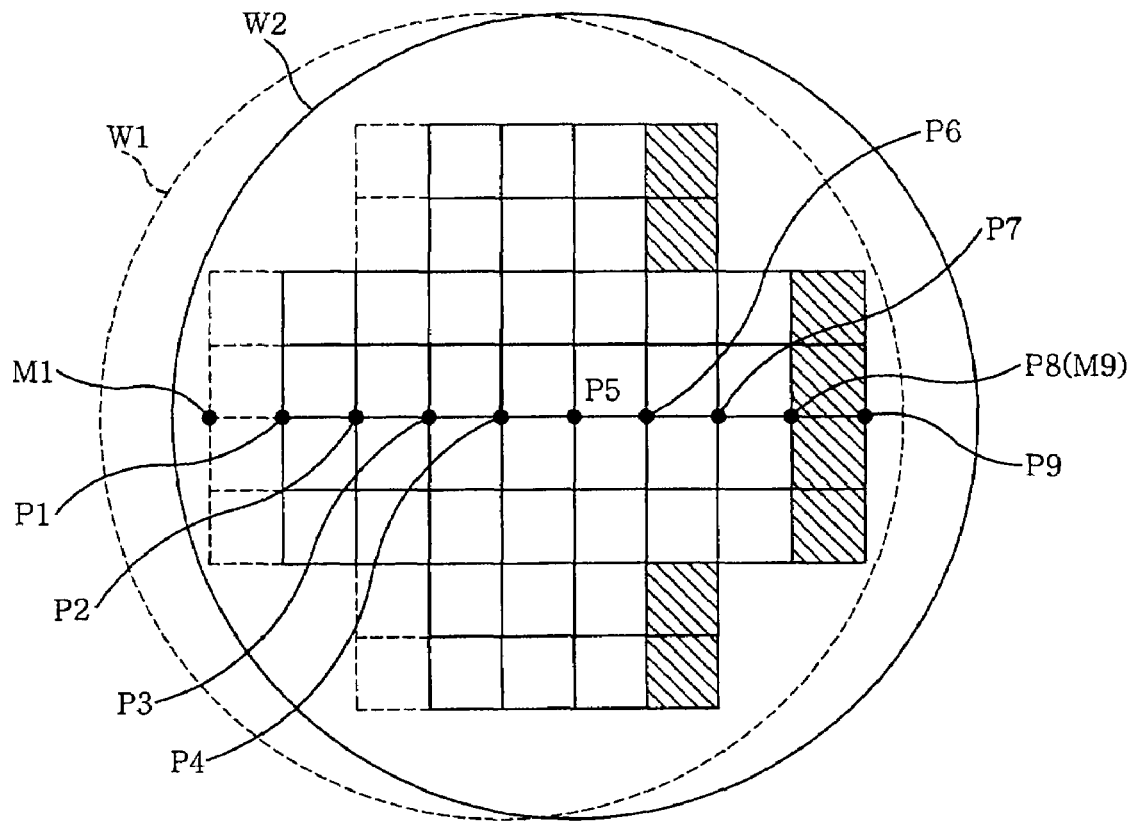
FIGS. 16A and 16B are schematic views showing a state where coordinates of the measuring wafer are corrected.
Figure 16B:
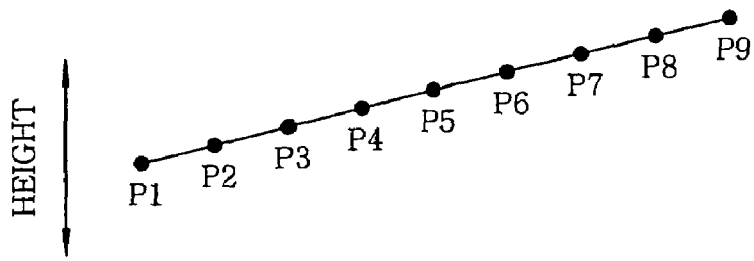
Figure 17:
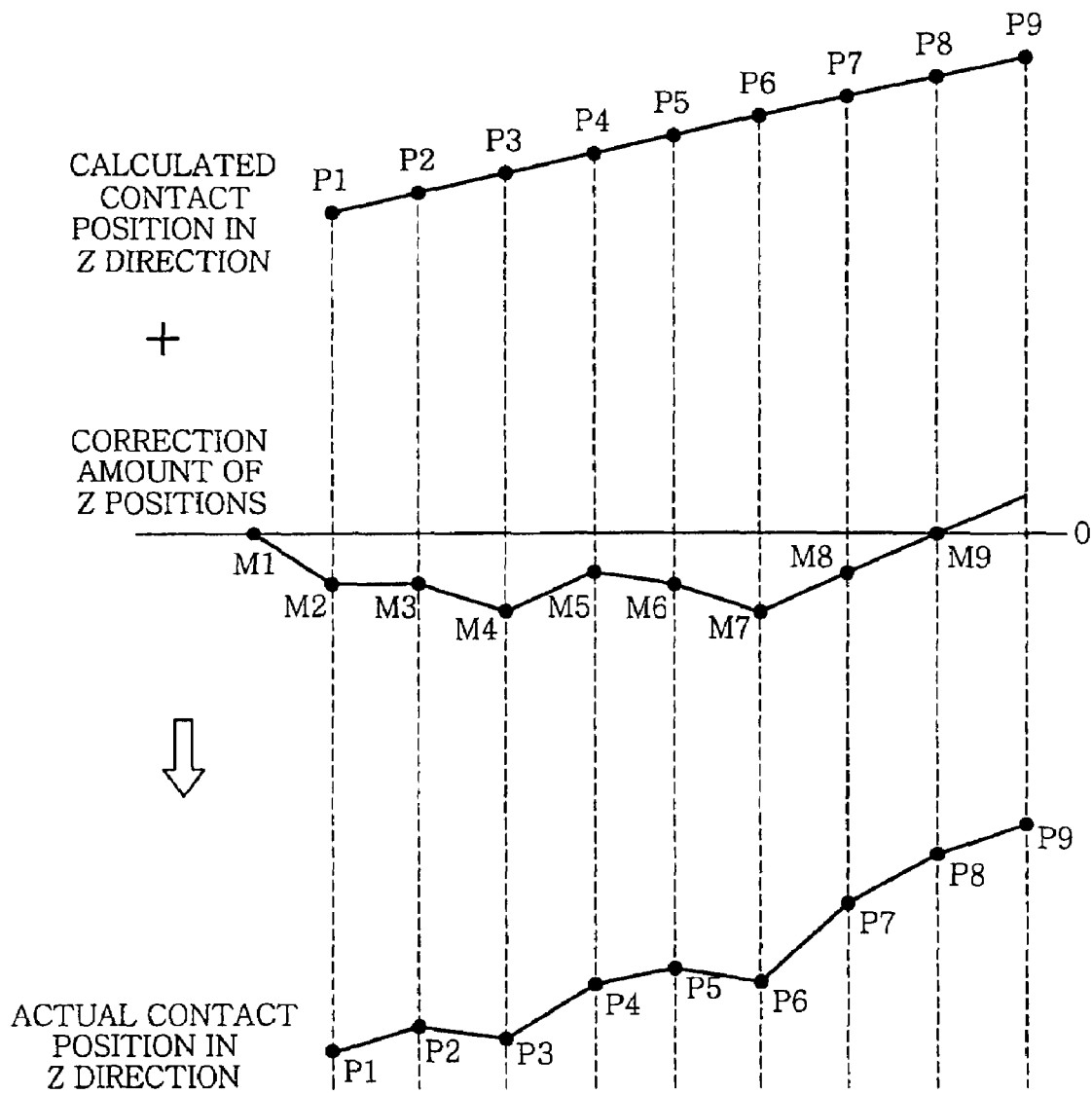
FIG. 17 is a schematic view of the correction process.

FIGS. 16 and 17 provide schematic views for explaining the series of coordinate converting operations. FIG. 16A shows that the inspection wafer W2 is mounted (adsorbed) on the mounting table 24 in a state where the pattern of specific points of the measuring wafer W2 are misaligned with the arrangement of the reference points on the reference wafer W1 by a single reference point. FIG. 16B shows the calculated contact positions in the Z direction of electrode pads P1 to P9 on the coordinates of the driving system, the electrode pads P1 to P9 being arranged horizontally and passing through the center of the wafer W. Since P1 to P8 correspond to M2 to M9, respectively, the correction amounts of the Z coordinate for P1 to P8 can be obtained by referring to the table 7a. In the case of P9 deviated from the area where the reference points of the reference wafer W1 are arranged, the calculated Z coordinate can be used without correction, for example. As a result, the actual contact positions in the Z direction of P1 to P9 are obtained as depicted in FIG. 17.

Figure 18:
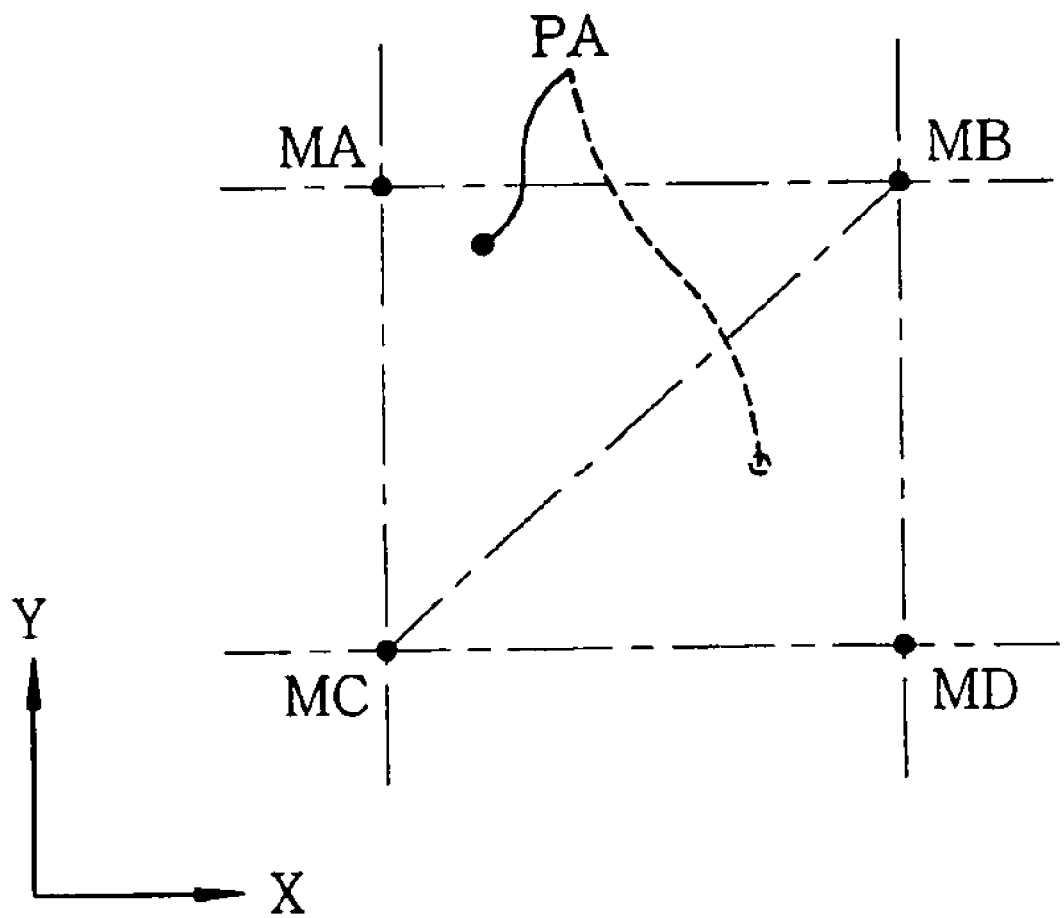
FIG. 18 offers a schematic view of the correction process.

In practice, however, the electrode pads P1 to P9 of the reference wafer W1 hardly coincide with the reference points M1 to M9. In most cases, an electrode pad PA is actually deviated from reference points MA to MD, e.g., as can be seen from FIG. 18. In such a case, the correction amounts in the X and Y directions of the calculated contact position of the electrode pad PA can be obtained as follows. Namely, there are obtained four reference points MA, MB, MC and MD on the reference wafer W1 which surround the electrode pad PA. When PA is positioned within the triangle formed by MA, MB and MC, the misalignments (the correction amounts) of PA, i.e., D1 (a1, b1), can be calculated as follows, on the assumption that the correction amounts of MA, MB and MC are D2 (a2, b2), D3 (a3, b3) and D4 (a4, b4), respectively.

$$a1=a3k1+a2(1-k1)$$

$$b1=b4k2+b2(1-k2)$$

Here, k1 and k2 indicate a ratio of a distance between PA and MA in the X and the Y direction, respectively. For example, k1 is obtained by dividing a distance in the X direction between PA and MA by a distance in the X direction between MA and MB, and k2 is obtained from the coordinates of MA and MC in the same manner. Moreover, when the coordinates of PA are within a triangle formed by MA, MB and MD, the correction amount can be calculated in the manner described above.

Figure 19A:
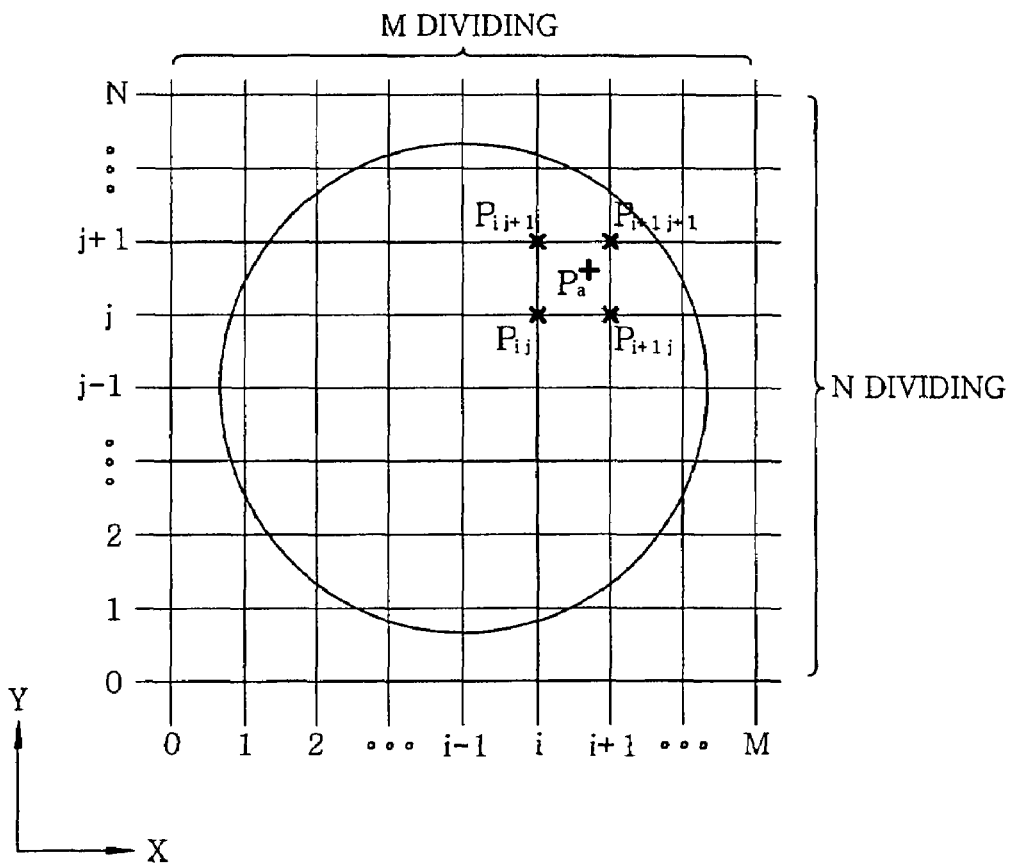
FIGS. 19A and 19B schematically describe the correction process.
Figure 19B:
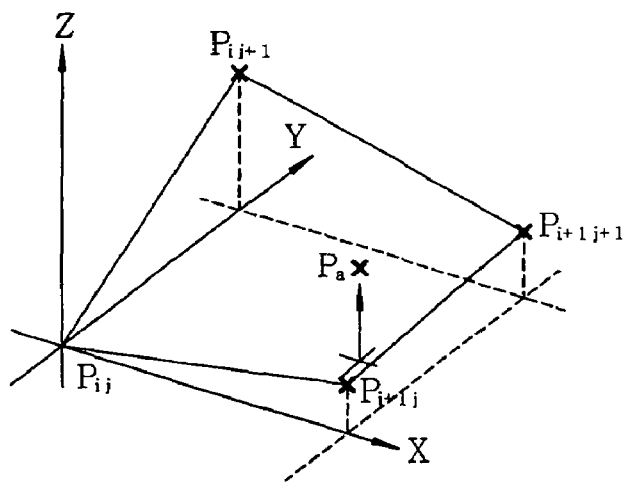
Figure 20A:
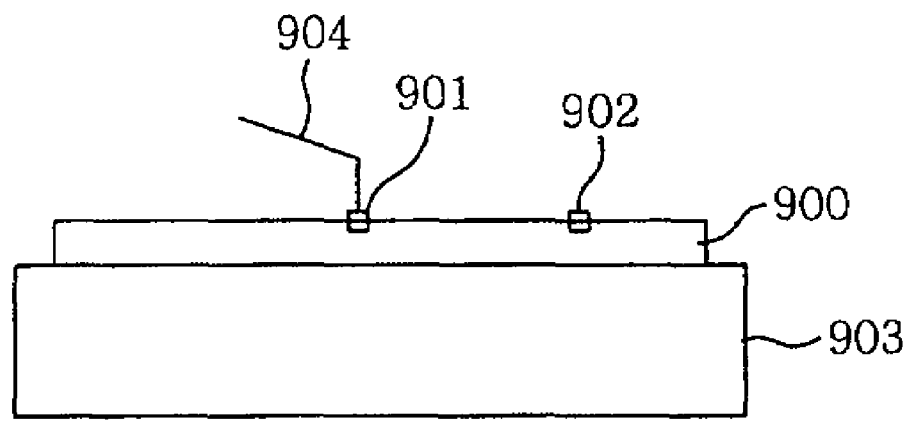
FIGS. 20A and 20B explain height positions of electrode pads when the mounting table is not distorted and when the mounting table is distorted.
Figure 20B:
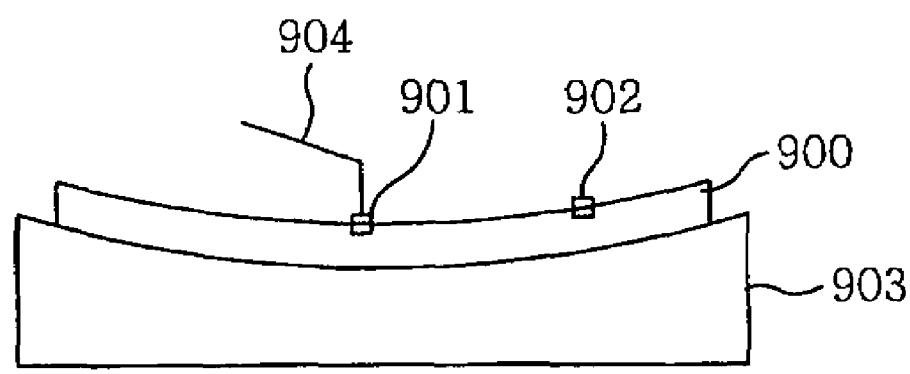

The correction amount in the Z direction can be calculated as shown in FIGS. 19A and 19B. Above all, grid points in FIG. 19A correspond to reference points of the reference wafer W1. $X_{ij}$ and $Y_{ij}$ represent coordinates of the reference points on the wafer, and $Z_{ij}$ indicates the correction amount of the Z coordinate of the calculated contact position at each of the coordinate points.

The correction amount in the Z direction of a point Pa (xa, ya) on a plane shown in FIG. 19A can be calculated as follows, wherein it is assumed that the point Pa is positioned either within a triangle formed by $P_{ij+1}$, $P_{i+1j+1}$ and $P_{i+1j}$ or within a triangle formed by $P_{ij}$, $P_{ij++1}$ and $P_{i+1j}$.

When Pa is within the triangle formed by $P_{ij+1}$, $P_{i+1j+1}$ and $P_{i+1j}$:

In this case, the three points of $P_{ij+1}$, $P_{i+1j+1}$ and $P_{i+1j}$ are raised in the Z direction by as much as the Z correction amounts thereof, as shown in FIG. 19B. The amount of elevation of an intersection point between a plane formed by the raised three points and Pa raised in the Z direction is the correction amount in the Z direction of Pa. Namely, the calculation is performed as follows.

$$z_a = (z_{ij+1} - z_{i+1j+1})/(x_{ij+1} - x_{i+1j+1}) \times (x_{ij+1} - x_a) + (z_{i+1j} - z_{i+1j+1})/(y_{i+1j} - y_{i+1j+1}) \times (y_{i+1j} - y_a) + z_{i+1j+1}$$

When Pa is within the triangle formed by $P_{ij}$, $P_{ij++1}$ and $P_{i+1j}$:

The correction amount $Z_a$ can be calculated in the same manner as follows.

$$z_a = (z_{i+1j} - z_{ij})/(x_{i+1j} - x_{1j}) \times (x_a - x_{ij}) + (z_{ij+1} - z_{ij})/(y_{ij+1} - y_{ij}) \times (y_a - y_{ij}) + z_{ij}$$

In accordance with the above embodiment, there is used correction data in which a plurality of reference points obtained by using the reference wafer W1 differing from the inspection wafer W2 is associated with the correction amounts corresponding to differences in the X, Y and Z directions between the actual positions and the calculated contact positions on the coordinates of the driving system obtained by alignment. Accordingly, it is possible to contact the probe needles 32 with the electrode pads of the chips to be inspected on the inspection wafer W2 while aligning the probe needles and the electrode pads in a height direction with high accuracy. Thus, this technique can be advantageously employed for the scaled-down electrode pads.

While the invention has been shown and described with respect to the embodiments, it will be understood by those skilled in the art that various changes and modification may be made without departing from the scope of the invention as defined in the following claims.

What is claimed is:

1. A probe apparatus for sequentially measuring electrical characteristics of chips to be inspected by contacting electrode pads of the chips with probes of a probe card by moving a mounting table which mounts thereon an inspection substrate, wherein the chips are arranged in columns and rows on the inspection substrate, and the mounting table is movable in X, Y and Z directions by a driving unit, the probe apparatus comprising:

an imaging unit that captures images of the electrode pads on the inspection substrate mounted on the mounting table or those of specific points on the mounted inspection substrate, each specific point having a specific positional relationship with an electrode pad;

means for calculating, based on a captured result of the imaging unit, contact positions in the X, Y and Z directions on coordinates of a driving system managed by the driving unit, wherein the probes are expected to contact with the electrode pads of the inspection substrate mounted on the mounting table at the contact positions;

a storage unit that stores correction data obtained in advance by using a reference substrate differing from the inspection substrate, wherein in the correction data, reference points on the reference substrate are associated with correction amounts corresponding to differences in the X, Y and Z directions between actual contact positions for the reference points and contact positions on the coordinates of the driving system calculated by using a captured result of the reference points by the imaging unit; and means for obtaining actual contact positions by obtaining relative positions of the electrode pads of the inspection substrate with respect to the reference points and correcting the contact positions calculated by the calculating means based on the relative positions and the correction data stored in the storage unit.

2. The probe apparatus of claim 1, wherein the reference points are positioned to correspond to grid points obtained by dividing the reference substrate in a grid pattern, and the means for obtaining the actual contact positions obtains a position in the Z direction of an electrode pad of the inspection substrate by treating the electrode pad to be on a plane formed by three reference points among four reference points forming a single grid.

3. The probe apparatus of claim 1, further comprising;

an imaging member that captures images of the probes, the imaging member being provided at a portion moving together with the mounting table in the X, Y and Z directions, wherein the calculating means calculates the contact positions based on the captured result of the imaging unit, a captured result of the imaging member, and a position in the X, Y and Z directions on the coordinates of the driving system which are obtained when optical axes of the imaging unit and the imaging member are aligned.

4. The probe apparatus of claim 1, wherein the calculating means is a program installed in a control unit of the probe apparatus.

5. The probe apparatus of claim 1, wherein the obtaining means is a program installed in a control unit of the probe apparatus.

6. A probing method for sequentially measuring electrical characteristics of chips to be inspected by contacting electrode pads of the chips with probes of a probe card by moving a mounting table which mounts thereon an inspection substrate, wherein the chips are arranged in columns and rows on the inspection substrate and the mounting table is movable in X, Y and Z directions by a driving unit, the probing method comprising:

(a) capturing, by using an imaging unit, images of the electrode pads on the inspection substrate mounted on the mounting table or those of specific points on the mounted inspection substrate, each specific point having a specific positional relationship with an electrode pad;

(b) calculating, based on a captured result of the imaging unit, contact positions in the X, Y and Z directions on coordinates of a driving system managed by the driving unit, wherein the probes are expected to contact with the electrode pads of the inspection substrate mounted on the mounting table at the contact positions;

(c) obtaining relative positions in the X and Y directions of the electrode pads of the inspection substrate with respect to a plurality of reference points on a reference substrate differing from the inspection substrate; and (d) obtaining actual contact positions by correcting the calculated contact positions obtained in the step (b) based on the relative positions obtained in the step (c) and correction data obtained in advance by using the reference substrate, wherein in the correction data the reference points on the reference substrate are associated with correction amounts corresponding to differences in the X, Y and Z directions between actual contact positions for the reference points and contact positions on the coordinates of the driving system calculated by using a captured result of the reference points by the imaging unit.

7. The probing method of claim 6, wherein the reference points are positioned to correspond to grid points obtained by dividing the reference substrate in a grid pattern, and the step (d) includes obtaining a position in the Z direction of an electrode pad of the inspection substrate by treating the electrode pad to be on a plane formed by three reference points among four reference points forming a single grid.

8. The probing method of claim 6, further comprising:
capturing images of the probes by using an imaging member provided at a portion moving together with the mounting table in the X, Y and Z directions,
wherein the step (b) includes calculating the contact positions based on the captured result of the imaging unit, a captured result of the imaging member, and a position in the X, Y and Z directions on the coordinates of the driving system which are obtained when optical axes of the imaging unit and the imaging member are aligned.

9. A storage medium storing a computer program for use in a probe apparatus for sequentially measuring electrical characteristics of chips to be inspected by contacting electrode pads of the chips with probes of a probe card by moving a mounting table which mounts thereon an inspection substrate, wherein the chips are arranged column-wisely and row-wisely on the inspection substrate, and the mounting table is movable in X, Y and Z direction by a driving unit, wherein the computer program is designed to perform the probing method described in claim 6.

* * * * *